US 9,673,316 B1

(12) United States Patent
Blair et al.

(10) Patent No.: US 9,673,316 B1
(45) Date of Patent: Jun. 6, 2017

(54) VERTICAL SEMICONDUCTOR DEVICE HAVING FRONTSIDE INTERCONNECTIONS

(71) Applicant: Maxim Integrated Products, Inc., San Jose, CA (US)

(72) Inventors: Christopher S. Blair, Lake Oswego, OR (US); Albert Bergemont, Palo Alto, CA (US); Sudarsan Uppili, Portland, OR (US); Fanling H. Yang, Beaverton, OR (US); Guillaume Bouche, Beaverton, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/929,872

(22) Filed: Jun. 28, 2013

Related U.S. Application Data

(60) Provisional application No. 61/789,766, filed on Mar. 15, 2013.

(51) Int. Cl.
  *H01L 29/80* (2006.01)
  *H01L 23/48* (2006.01)
  *H01L 29/78* (2006.01)
  *H01L 21/50* (2006.01)

(52) U.S. Cl.
  CPC ......... *H01L 29/7809* (2013.01); *H01L 21/50* (2013.01); *H01L 29/7801* (2013.01); *H01L 29/7802* (2013.01); *H01L 29/7835* (2013.01)

(58) Field of Classification Search
  CPC ............... H01L 2924/00; H01L 23/481; H01L 29/7835; H01L 29/7809; H01L 2225/06541; H01L 21/76898; H01L 21/8221; H01L 23/5226; H01L 29/7801; H01L 2224/05009; H01L 2224/05548; H01L 29/7802; H01L 21/50
  USPC .......... 257/774, E23.011, E29.262, 343, 257/E23.174, 328, 276, 698, 621
  See application file for complete search history.

(56) References Cited

U.S. PATENT DOCUMENTS

| 5,486,715 A * | 1/1996 | Zommer | H01L 23/5222 257/341 |
|---|---|---|---|
| 5,635,742 A * | 6/1997 | Hoshi et al. | 257/337 |
| 8,487,371 B2 * | 7/2013 | Kinzer et al. | 257/330 |
| 2007/0034911 A1 * | 2/2007 | Kao | 257/288 |

(Continued)

FOREIGN PATENT DOCUMENTS

WO   WO2010/083092   7/2010

*Primary Examiner* — Shouxiang Hu
(74) *Attorney, Agent, or Firm* — Advent, LLP

(57) ABSTRACT

A semiconductor device including a VDMOS device formed therein includes a terminal, or contact, to the drain region of the VDMOS device from the frontside of the device. In one or more implementations, a semiconductor device includes a semiconductor substrate having a first surface and a second surface and a vertical diffused metal-oxide-semiconductor device formed within the semiconductor substrate. The vertical diffused metal-oxide-semiconductor device includes at least one source region formed proximate to the first surface and at least one drain region formed proximate to the second surface. A through-substrate via is formed within the semiconductor substrate, and the through-substrate via is electrically connected to the drain region. The through-substrate via provides an electrical interconnection to the drain region from the first surface.

8 Claims, 6 Drawing Sheets

(56) References Cited

U.S. PATENT DOCUMENTS

2010/0178747 A1    7/2010  Ellul et al.
2010/0289092 A1*  11/2010  Perng et al. .................. 257/401
2011/0266683 A1*  11/2011  Feng ............................. 257/773
2012/0104580 A1*  5/2012  Feng et al. .................... 257/673

* cited by examiner

VERTICAL SEMICONDUCTOR DEVICE HAVING FRONTSIDE INTERCONNECTIONS

CROSS-REFERENCE TO RELATED APPLICATIONS

The present application claims the benefit under 35 U.S.C. §119(e) of U.S. Provisional Application Ser. No. 61/789,766, entitled "VERTICAL SEMICONDUCTOR DEVICE HAVING FRONTSIDE INTERCONNECTIONS," filed on Mar. 15, 2013. U.S. Provisional Application Ser. No. 61/789,766 is herein incorporated by reference in its entirety.

BACKGROUND

Power metal-oxide-semiconductor field-effect transistor (MOSFET) devices, such as vertical diffused metal oxide semiconductor (VDMOS) devices, are used in power application devices because they complement both bipolar devices and complementary metal-oxide-semiconductor CMOS devices through bi-polar-CMOS-DMOS (BCD) processes. For example, VDMOS devices may be used in power supplies, buck converters, and low voltage motor controllers to furnish power application functionality.

SUMMARY

A semiconductor device including a VDMOS device formed therein includes a terminal, or contact, to the drain region of the VDMOS device from the frontside of the device. In one or more implementations, a semiconductor device includes a semiconductor substrate having a first surface and a second surface and a vertical diffused metal-oxide-semiconductor device formed within the semiconductor substrate. The vertical diffused metal-oxide-semiconductor device includes at least one source region formed proximate to the first surface and at least one drain region formed proximate to the second surface. A through-substrate via is formed within the semiconductor substrate, and the through-substrate via electrically connected to the drain region. The through-substrate via provides an electrical interconnection to the drain region from the first surface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Vertical diffused metal-oxide-semiconductor (VDMOS) devices include one or more source regions and a drain region. The source regions are formed proximate to a first surface of a semiconductor substrate and the drain region is formed proximate to a second surface of the semiconductor substrate. These devices also include a gate formed over the source regions to operate the VDMOS devices. Additionally, the terminals (e.g., contacts) for the source regions and the gate are available from the frontside of the device (e.g., available from the first surface) while the terminal for the drain region is available from the backside of the device (e.g., available from the second surface).

Accordingly, a semiconductor device including a VDMOS device formed therein includes a terminal, or contact, to the drain region of the VDMOS device from the frontside of the device. In one or more implementations, a semiconductor device includes a semiconductor substrate having a first surface and a second surface and a vertical diffused metal-oxide-semiconductor device formed within the semiconductor substrate. The vertical diffused metal-oxide-semiconductor device includes at least one source region formed proximate to the first surface and at least one drain region formed proximate to the second surface. A through-substrate via is formed within the semiconductor substrate, and the through-substrate via electrically connected to the drain region. The through-substrate via provides an electrical interconnection to the drain region from the first surface. In another implementation, the through-substrate via is electrically connected directly to the drain region to provide a frontside electrical contact with the backside of the device.

Example Implementations

Figure 1A:
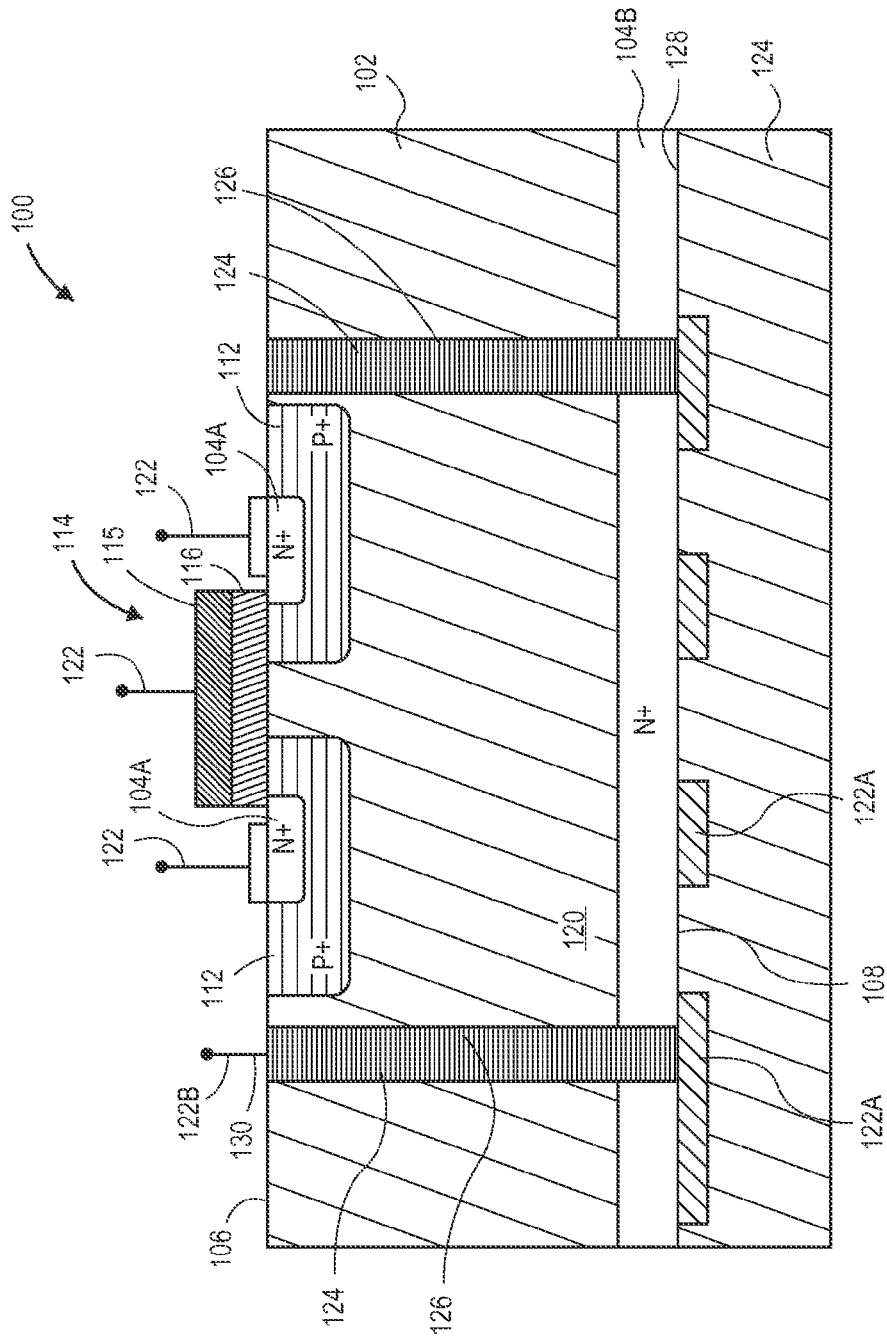
FIG. 1A is a diagrammatic partial cross-sectional view illustrating a semiconductor device having one or more vias in accordance with an example implementation of the present disclosure.
Figure 1B:
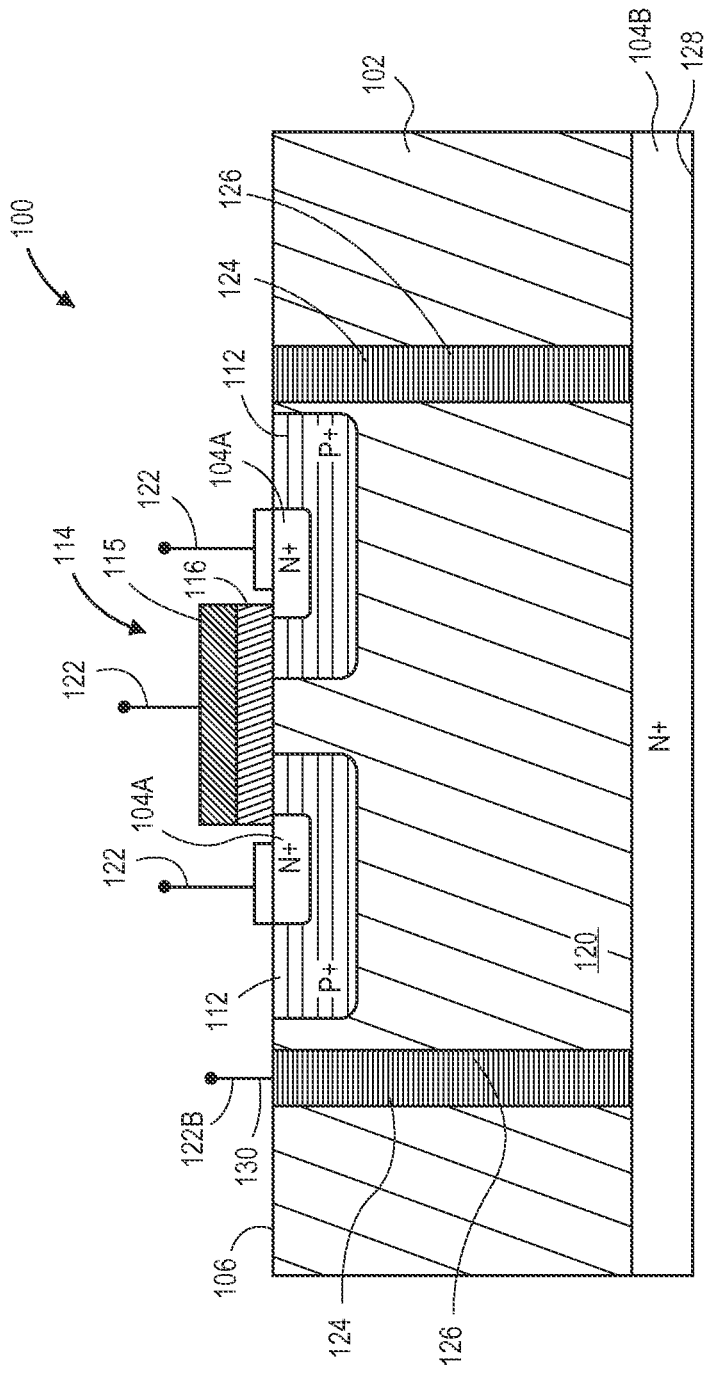
FIG. 1B is another diagrammatic partial cross-sectional view illustrating another semiconductor device having one or more vias in accordance with an example implementation of the present disclosure.

FIGS. 1A and 1B illustrate example semiconductor devices 100 in accordance with an example implementation of the present disclosure. In one or more implementations, the semiconductor device 100 is configured as a vertical diffused metal-oxide-semiconductor (VDMOS) device while providing lateral diffused metal-oxide-semiconductor device (LDMOS) functionality (e.g., an electrical connection to the drain region of the VDMOS device is available from the frontside of the device 100). The substrate 102 furnishes a base material utilized to form one or more electronic devices through various fabrication techniques such as photolithography, ion implantation, deposition, etching, and so forth. The substrate 102 may comprise n-type silicon (e.g., a silicon doped with a group carrier element, such as a group V element (e.g., phosphorus, arsenic, antimony, etc.), to furnish n-type charge carrier elements to the silicon) or p-type silicon (e.g., silicon doped with a group carrier element, such as a group IIIA element (e.g., boron, etc.), to furnish p-type charge carrier elements to the silicon, or other group elements to furnish p-type charge carrier elements). The semiconductor device 100 includes one or more active regions 104 (e.g., source regions 104A, drain regions 104B) formed in a semiconductor substrate 102. For instance, the device 100 may include one or more source regions 104A and a single drain region 104B.

The active regions 104 are utilized to create integrated circuit device technology (e.g., metal-oxide-semiconductor (MOS) technology, microelectromechanical systems (MEMS) technology, etc.). In an implementation, the active regions 104 are capable of providing charge carriers within the substrate 102. For example, the active silicon regions 104 may be comprised of an n-type diffusion region (e.g., a first conductivity type) that is capable of providing extra conduction electrons as charge carriers. In another example, the active silicon regions 104 may be comprised of a p-type diffusion region (e.g., a second conductivity type), that is capable of providing extra holes as charge carriers. One or more active regions 104 (e.g., the source regions 104A) of the device 100 are formed proximate (e.g., adjacent) to a first surface 106 of the substrate 102. The drain region 104B of the device is formed proximate (e.g., adjacent) to a second surface 108 of the substrate 102.

As shown, the source regions 104A are formed within well regions 112. The well regions 112 are comprised of the opposite conductivity type as source regions 104A. For example, the source regions 104 may be comprised of a dopant material of the first conductivity type and the regions 112 are comprised of dopant material of the second conductivity type. In another example, the source regions 104 may be comprised of a dopant material of the second conductivity type and the regions 112 are comprised of dopant material of the first conductivity type. Portions of the regions 112 may serve as the channel regions (e.g., regions under the gate described herein) when the device is operational.

A gate 114 is formed over the first surface 106 of the device 100. As shown, the gate 114 may include a first layer 116, such as a dielectric layer, disposed between the surface 106 and a second layer 118 (e.g., a polycrystalline silicon (polysilicon) layer or a metal electrode layer). In one or more implementations, the first layer 116 may comprise a gate oxide material, such as silicon dioxide ($SiO_2$), a nitride material, a high-κ material, or the like. The second layer 118 may further include a silicide material to lower the resistivity of the layer 118. In various implementations, the thickness of the gate 114 may range from approximately one hundred (100) Angstroms to approximately ten thousand (10,000) Angstroms. However, the thickness of the gate 114 may vary as a function of the requirements (e.g., manufacturability, operating frequency, gain, efficiency, thickness, etc.) of the device 100.

The semiconductor device 100 also includes an epitaxial region 120 that is configured as a path for majority carriers to travel when the device 100 is operational. As shown in FIGS. 1A and 1B, the epitaxial region 120 is comprised of material of the first conductivity type. However, the doping profile of the epitaxial region 120 is lower than the doping profile of the regions 104A, 104B. For example, the epitaxial region 120 may have a dopant concentration of about 5 e15/cm³ of the first conductivity type. The electric field across the epitaxial region 120 may be manipulated by the doping profile and the thickness of the epitaxial region 120 when the device 100 is operational. Thus, it is contemplated that various doping profiles and thicknesses of the epitaxial region 120 may be utilized depending on the requirements (e.g., breakdown voltage value, operating voltages, etc.) of the semiconductor device 100.

The source regions 104A, the drain regions 104B, and the gates 114 are electrically interconnected to one or more electrical interconnections 122 (e.g., contacts or electrodes) that provide electrical interconnection functionalities between various components of device 100. The interconnections 122 may be configured in a variety of ways. For example, the interconnections 122 may be comprised of a polysilicon material, a metal one (metal 1) material, a metal two (metal 2) material, and so forth. In some applications, the interconnections 122 may be vias that provide a vertical electrical connection between different layers of the device 100.

As shown, one or more of the back side electrical interconnections 122A (i.e., interconnections proximate to the second surface 108) are electrically connected to one or more front side electrical interconnections 122B (i.e., interconnections proximate to the first surface 106). In a specific implementation, as shown in FIG. 1A, the back side electrical interconnections 122A are electrically connected to the front side electrical interconnections 112B by way of through-substrate vias (TSVs) 124. The TSVs 124 extend at least substantially through the substrate 102. In one or more implementations, the TSVs 124 have an aspect ratio of at least approximately 1:1 to at least approximately 10:1. The TSVs 124 include a conductive material 126, such as copper, poly-silicon, or the like, deposited therein. In a specific implementation, the TSVs 124 may have an approximate size (width) ranging from about fifty micrometers (50 um) to about 5 micrometers (5 um) and an approximate depth ranging from about fifty micrometers (50 um) to about one hundred micrometers (100 um).

As shown in FIG. 1A, a second substrate 126, such as a portion of a second wafer, is bonded to the first substrate 102. The second surface 108 of the first substrate 102 interfaces with a surface 128 of the second substrate 126. The second substrate 126 may include the back side electrical interconnections 122A (e.g., electrical conduits) that electrically interface with front side electrical interconnections 122B by way of the one or more TSVs 124. The back side electrical interconnections 122A serves to function as a drain terminal (e.g., contact) 130 for the drain 104B. Thus, the drain terminal 130 is available from the frontside of the device 100 (e.g., electrical connection is available over the surface 106). In other words, the VDMOS device is converted, functionally, to a LDMOS device having a drain contact available frontside.

FIG. 1B illustrates another semiconductor device 100 in accordance with an example implementation of the present disclosure. In this implementation, the TSVs 124 extend to the drain region 104B. Thus, the TSVs 124 are electrically connected directly to the drain region 104B to provide a frontside electrical connection to the backside of the semiconductor device 100.

Example Fabrication Techniques

Figure 2:
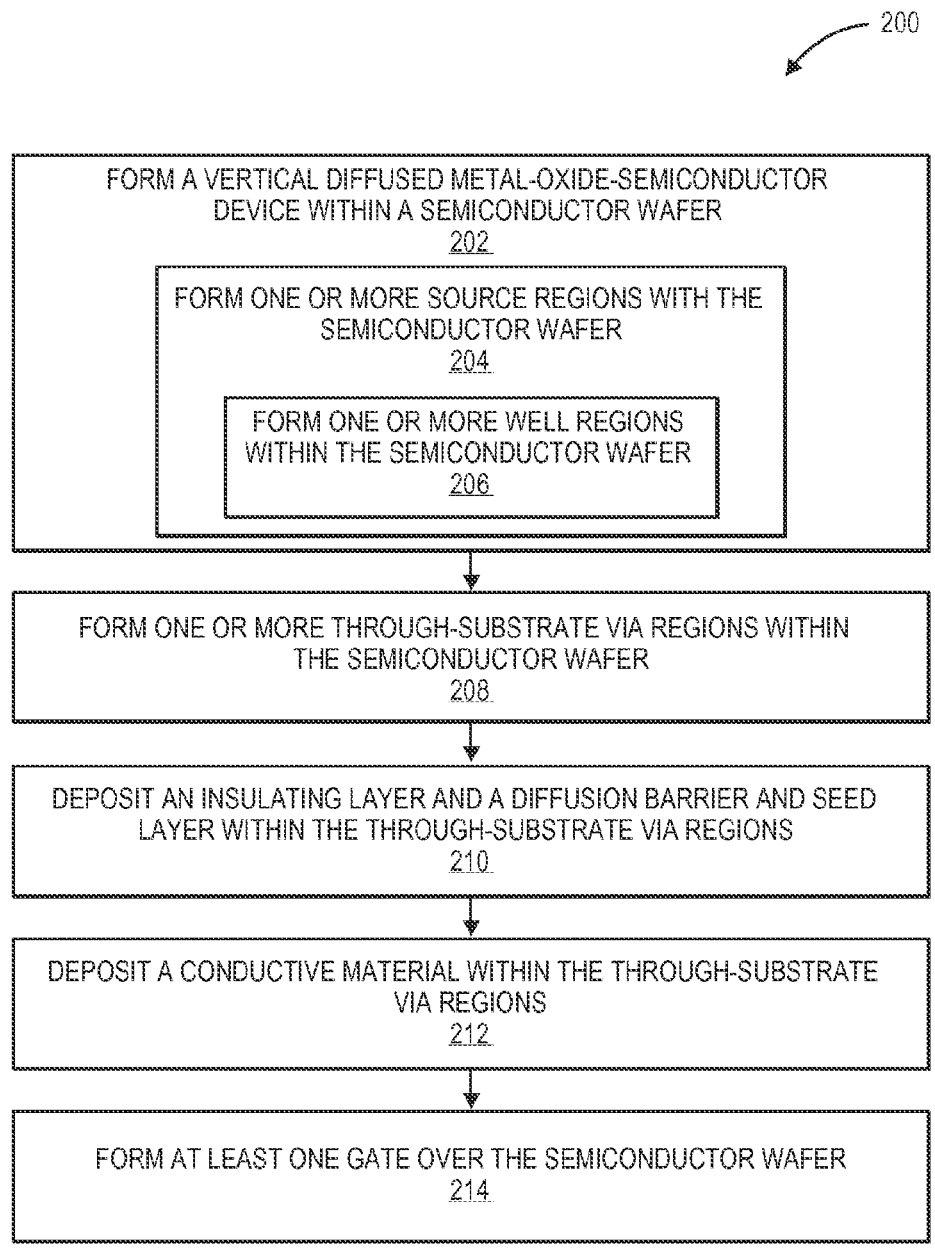
FIG. 2 is a flow diagram illustrating a process in an example implementation for fabricating semiconductor devices having one or more vias, such as the device shown in FIG. 1A.
Figure 3:
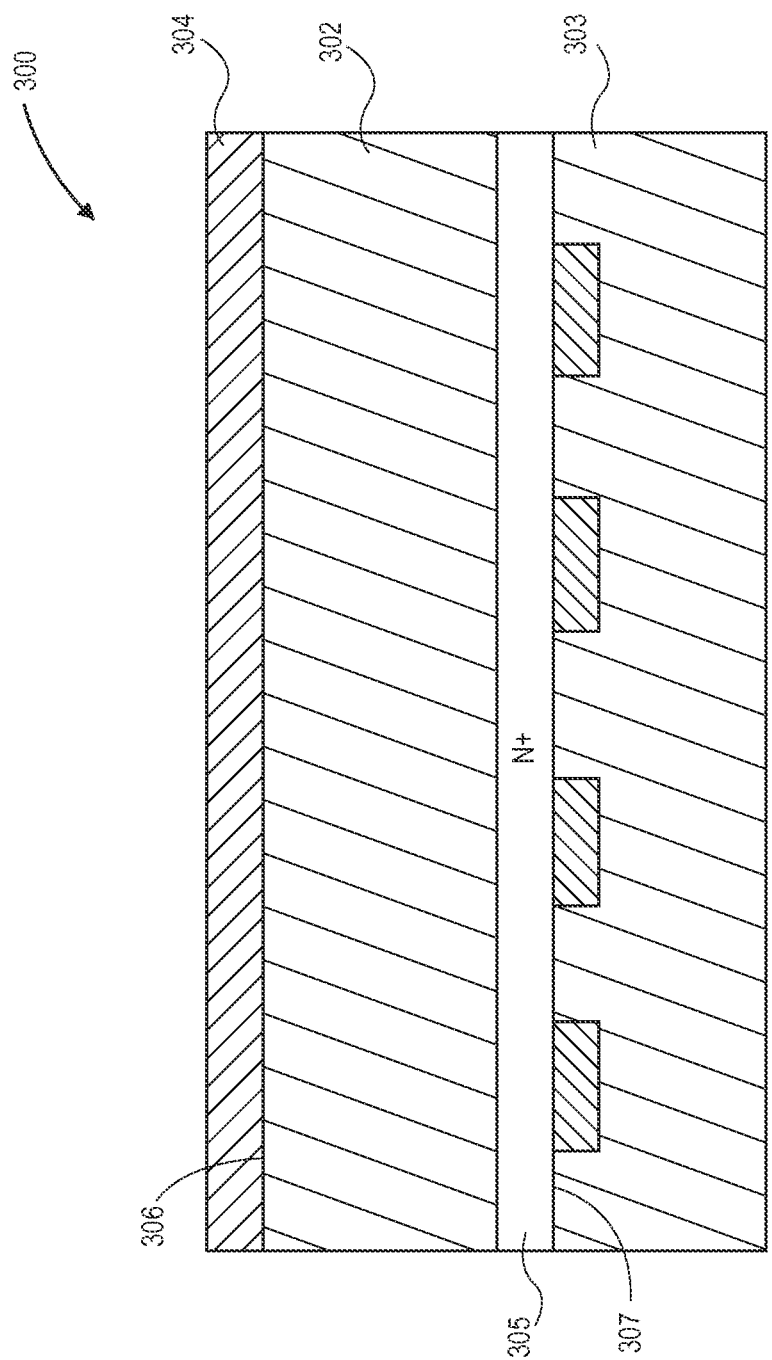
FIGS. 3 through 7 are diagrammatic partial cross-sectional views illustrating the fabrication of a semiconductor device having one or more vias such as the device shown in FIG. 1A, in accordance with the process shown in FIG. 2.

FIG. 2 illustrates example process 200 that employs semiconductor fabrication techniques to fabricate semiconductor devices having a VDMOS formed in a semiconductor substrate, such as the device 100 shown in FIG. 1A. FIGS. 3 through 6 illustrate formation of example semiconductor devices 300 in an example semiconductor wafer 302, which is bonded to a second wafer 303. As illustrated in FIG. 2, a VDMOS device is formed within a semiconductor wafer (Block 202). As shown in FIG. 3, a wafer 302 includes a photoresist layer 304 formed over a first surface 306. The photoresist layer 304 is patterned and etched to remove selective portions of the layer 304. It is understood that this process may occur multiple times to facilitate formation of the device 300. For example, a first photoresist layer 304 may be patterned, etched, and stripped (upon finalization of a semiconductor fabrication process), and then a second photoresist layer 304 may be patterned, etched, and stripped (upon finalization of another semiconductor fabrication process). As shown, the wafer 302 includes a drain region 305 that is formed proximate to the surface 307.

As shown in FIG. 2, one or more source regions are formed within the semiconductor wafer (Block 204). As mentioned above, the source regions 308 may be comprised of dopant of a first conductivity type or a second conductivity type (see FIG. 4). This process may also include formation of regions 309, which function as a well structure to form the sources 308 within. For example, the source regions 308 may be comprised of a first conductivity type and the regions 309 are comprised of the second conductivity type. Thus, well regions are formed within the semiconductor wafer (Block 206). As described above, an photoresist layer 304 may be formed (or re-formed), etched, and stripped to allow the wafer 302 to be subjected to one or more semiconductor formation processes. For instance, a well region of the second conductivity type may be formed within the wafer 302. The source regions 308 are then formed within the well regions 309. As described above, portions of the well regions 309 function as channel regions when the device is operation.

Figure 5:
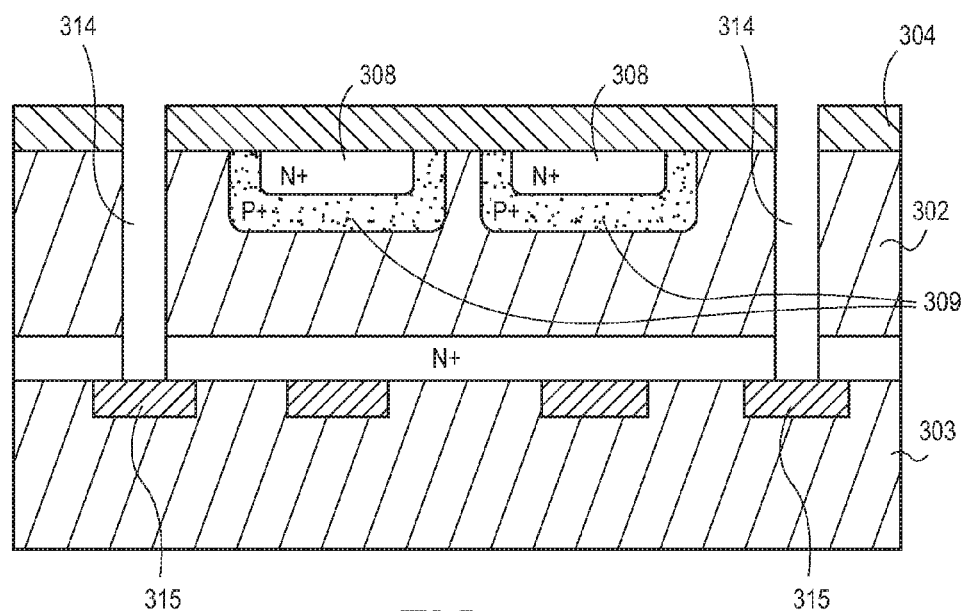
Figure 6:
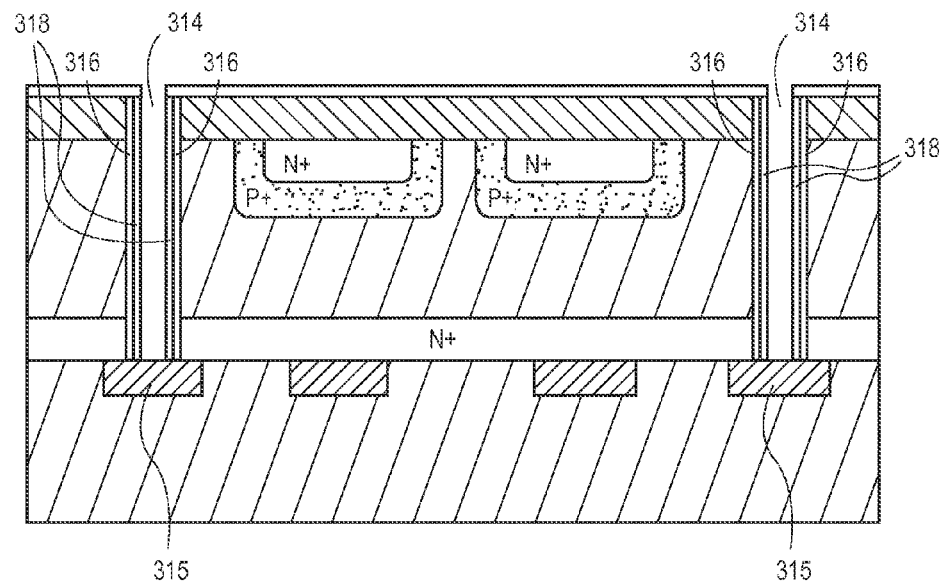
Figure 7:
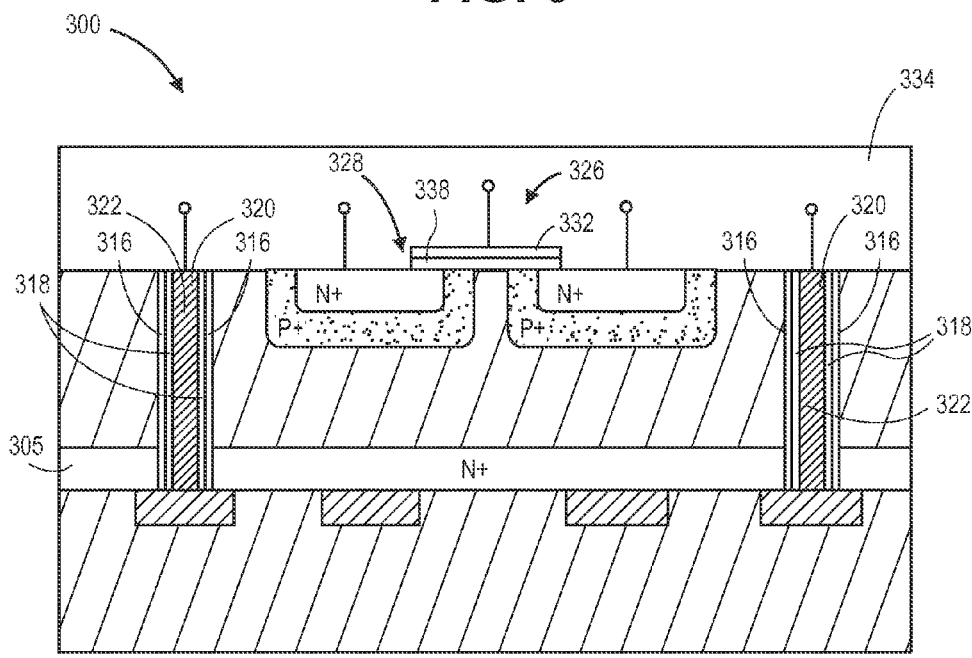

One or more through-substrate vias are formed within the semiconductor wafer (Block 208). As shown in FIG. 5, one or more TSV regions 314 are formed within the wafer 302. The TSV regions 314 may be formed by etching selective regions of the wafer 302. The etch is configured to complete once the etching process reaches the surface of the wafer 303 that interfaces with the wafer 302. For example, the second wafer 303 includes one or more electrical interconnections (e.g., conduits) 315 that are configured to terminate the etch process. In one or more implementations, the interconnections 315 comprise a conductive material, such as a metal 1 layer, a polysilicon layer, or the like.

Figure 4:
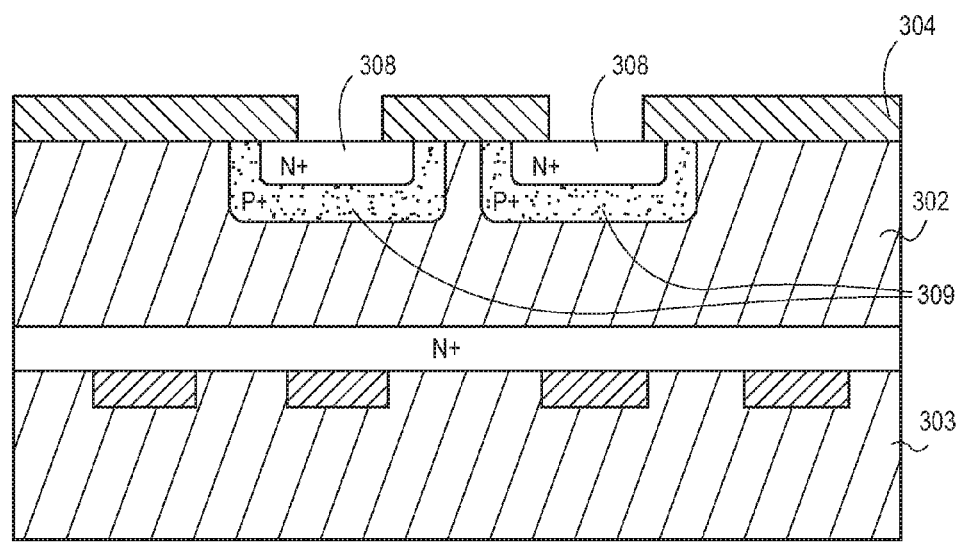

An insulating layer and a diffusion barrier metal and seed layer are deposited within the TSV regions (Block 210). As shown in FIG. 4, an insulating layer 316 is deposited within the TSV regions 314 to electrically isolate the TSV regions 314 from the wafer 302. In an implementation, the insulating layer 316 may be an oxide layer ($SiO_2$), or the like. An anisotropic dry etch process is used to clear the insulating layer from the bottom of the TSV while retaining this insulating layer on the sidewalls of the TSV regions 314. Next, a diffusion barrier metal (e.g., Ti, etc.) and a seed metal layer 318 are deposited over the surface 306. The diffusion barrier metal and seed metal layer 318 may be patterned (through suitable lithography steps) to provide electrical interconnections between various components.

A conductive material is deposited within the TSV regions (Block 212). As shown in FIG. 5, a conductive material 320 is deposited within the TSV regions 314 to form TSVs 322 and over the surface 306 to form a frontside electrical interconnection 324 (e.g., the TSV 322 fill and the formation of the frontside electrical interconnection 324 may be accomplished in a single plating (e.g., copper plating) process). In one or more implementations, the conductive material 320 may be deposited through one or more suitable plating techniques.

At least one gate is formed over the semiconductor wafer (Block 214). At least one gate 326 for the VDMOS device 328 may be formed over the surface 306 of the wafer 302 (see FIG. 6). For example, an oxide layer 330 and a polysilicon layer 332 are deposited over the top surface 306 of the wafer 302. The oxide layer 330 and the polysilicon layer 332 are defined through various gate formation processes. In an implementation, the layers 330, 332 may be subjected to a suitable photolithography process and a suitable etching process to form the gate 326. A passivation layer 334 may then be formed over the surface 306 to at least substantially insulate the components of the device 300.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
    a first semiconductor substrate having a planar top surface and a planar bottom surface;
    a vertical diffused metal-oxide-semiconductor device disposed at least partial within the semiconductor substrate, the vertical diffused metal-oxide-semiconductor device having a first source region and a second source region disposed proximate to the planar top surface and at least one drain region disposed proximate to the planar bottom surface, the vertical diffused metal-oxide-semiconductor device including an epitaxial region, the epitaxial region surrounding a first source region and a second source region;
    a gate extending across the planar top surface and disposed over at least a portion of the first source region and at least a portion of the second source region;
    a single passivation layer disposed over the planar top surface, the single passivation layer at least substantially encapsulating the gate;
    a through-substrate via disposed within the first semiconductor substrate;
    a front side electrical interconnection electrically connected to the through-substrate via and disposed over the planar top surface; and
    a second semiconductor substrate coupled to the planar bottom surface of the first semiconductor substrate, the second semiconductor substrate including at least one back side electrical interconnection disposed therein, the at least one back side electrical interconnection for terminating the through-substrate via, the at least one back side electrical interconnection electrically connected to the at least one drain region, wherein the at least one back side electrical interconnection is in contact with the planar bottom surface of the first semiconductor substrate prior to the through-substrate via being formed, and
    wherein the through-substrate via provides an electrical interface between the front side electrical interconnection and the at least one back side electrical interconnection.

2. The semiconductor device as recited in claim 1, wherein a first source region and a second source region and the at least one drain region comprise an n-type dopant material.

3. The semiconductor device as recited in claim 1, wherein the at least one source region and the at least one drain region comprise a p-type dopant material.

4. The semiconductor device as recited in claim 1, wherein the through-substrate via includes at least one of a copper material or a polysilicon material.

5. A semiconductor device comprising:
    a first semiconductor substrate having a planar top surface and a planar bottom surface;
    a vertical diffused metal-oxide-semiconductor device disposed at least partially within the semiconductor substrate, the vertical diffused metal-oxide-semiconductor device having a first source region and a second source region disposed proximate to the planar top surface and at least one drain region disposed proximate to the planar bottom surface, the vertical diffused metal-oxide-semiconductor device including an epitaxial region, the epitaxial region surrounding a first source region and a second source region;

a gate extending across the planar top surface and disposed over at least a portion of the first source region and at least a portion of the second source region;

a through-substrate via disposed within the first semiconductor substrate, the through-substrate via having an aspect ratio ranging from 1:1 to 10:1;

a front side electrical interconnection electrically connected to the through-substrate via and disposed over the first surface; and a second semiconductor substrate coupled to the planar bottom surface of the semiconductor substrate having at least one back side electrical interconnection disposed therein, the at least one back side electrical interconnection electrically connected to the at least one drain region, the at least one back side electrical interconnection for terminating the through-substrate via, wherein the at least one back side electrical interconnection is in contact with the planar bottom surface of the first semiconductor substrate prior to the through-substrate via being formed, and wherein the through-substrate via furnishes an electrical interface between the front side electrical interconnection and the at one least back side electrical interconnection.

6. The semiconductor device as recited in claim 5, wherein a first source region and a second source region and the at least one drain region comprise an n-type dopant material.

7. The semiconductor device as recited in claim 5, wherein the least one source region and the at least one drain region comprise a p-type dopant material.

8. The semiconductor device as recited in claim 5, wherein the through-substrate via includes at least one of a copper material or a polysilicon material.

* * * * *